(12) United States Patent
Hung et al.

(10) Patent No.: US 8,953,137 B2
(45) Date of Patent: Feb. 10, 2015

(54) FLEXIBLE DISPLAY

(71) Applicant: AU Optronics Corp., Hsin-Chu (TW)

(72) Inventors: Wei-Lun Hung, Hsin-Chu (TW);
Shih-Hsing Hung, Hsin-Chu (TW);
Chih-Jen Hu, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 267 days.

(21) Appl. No.: 13/676,139

(22) Filed: Nov. 14, 2012

(65) Prior Publication Data

US 2013/0153270 A1  Jun. 20, 2013

(30) Foreign Application Priority Data

Dec. 20, 2011  (TW) .............................. 100147452 A

(51) Int. Cl.
*G02F 1/1333*  (2006.01)
*H05K 1/02*  (2006.01)
*H01L 29/786*  (2006.01)
*H01L 27/12*  (2006.01)

(52) U.S. Cl.
CPC ........ *H05K 1/0277* (2013.01); *H01L 29/78603* (2013.01); *H01L 27/1218* (2013.01); *G09G 2380/02* (2013.01)
USPC ....................................................... 349/158

(58) Field of Classification Search
USPC ........................................................ 349/158
See application file for complete search history.

(56) References Cited

U.S. PATENT DOCUMENTS

| 6,614,057 | B2 | 9/2003 | Silvernail et al. |
| 8,149,498 | B2 | 4/2012 | Hsieh |
| 2010/0213819 | A1 | 8/2010 | Cok |
| 2011/0095285 | A1 | 4/2011 | Shu |
| 2011/0139747 | A1 | 6/2011 | Lee |
| 2011/0143079 | A1 | 6/2011 | Lee |

FOREIGN PATENT DOCUMENTS

| CN | 101794538 A | 8/2010 |
| TW | 201115740 | 5/2011 |

*Primary Examiner* — Phu Vu
(74) *Attorney, Agent, or Firm* — Winston Hsu; Scott Margo

(57) ABSTRACT

A flexible display including a flexible substrate, an array circuit layer, a protection film, and an adhesive layer is provided. The flexible substrate has a first surface and a second surface, disposed opposite to each other. The array circuit layer is disposed on the second surface of the flexible substrate. The protection film is disposed on the first surface of the flexible substrate. The adhesive layer is disposed between the protection film and the flexible substrate, and has a thickness, substantially greater than or equal to 30 micrometers.

14 Claims, 9 Drawing Sheets

FLEXIBLE DISPLAY

BACKGROUND OF THE INVENTION

1. Field of the Invention

The present invention is related to a flexible display, and more particularly, to a flexible display having an adhesive layer with a thickness greater than or equal to 30 micrometers (μm), which is used for attaching a protection film.

2. Description of the Prior Art

Reading words or pictures printed on paper is the most familiar reading method for human beings. As paper printing techniques have advanced and printing costs have lowered, paper has been extensively used as a data storage medium for hundreds of years. However, as display techniques advance, it is possible that in the near future, paper may be replaced by flexible display. Like paper, flexible display is thin in profile, small in size, lightweight, easy to carry, and flexible. Therefore, it is expected that the flexible display can be applied in electronic paper or electronic books, replacing conventional paper and books as a popular data storage medium.

In the technology of fabricating the flexible display, thin film transistor (TFT) elements are fabricated on the flexible substrate, and then display elements are fabricated on the TFT elements. After that, a protection film is covered on the display elements for protecting the display elements. Therefore, the flexible display has flexibility. In order to protect the flexible substrate, on which the TFT elements are fabricated thereon, for avoid an external force damaging the flexible substrate by poking or scraping or directly damaging the TFT elements fabricated on the flexible substrate, a protection film is usually attached on an out side of the flexible substrate of the flexible display. However, foreign matters are likely adhered to the out side of the flexible substrate, thus they will be covered or packed between the protection film and the flexible substrate when attaching the protection film onto the flexible substrate, resulting in some protrusions of the flexible substrate at the side having the TFT elements, which will damage the TFT elements or cause circuit broken.

SUMMARY OF THE INVENTION

It is one of the main objectives of the present invention to provide a flexible display for preventing the TFT elements of the flexible display from being damaged or broken.

In order to achieve the above-mentioned objective, the present invention provides a flexible display, comprising a flexible substrate, an array circuit layer, a first protection film and a first adhesive layer. The flexible substrate has a first surface and a second surface opposite to each other. The array circuit layer is disposed on the second surface of the flexible substrate. The first protection film is disposed on the first surface of the flexible substrate. The first adhesive layer is disposed between the first protection film and the flexible substrate, and the first adhesive layer has a thickness substantially greater than or equal to 30 μm.

According to the present invention, the thickness of the first adhesive layer for attaching the first protection film to the first surface of the flexible substrate is raised to be greater than or equal to 30 μm, so as to effectively parcel foreign matters having particle diameters less than or equal to 30 μm in the first adhesive layer, such that the foreign matters will not press the flexible substrate during attaching the first protection film and the flexible substrate and the flexible substrate will not protrude along the direction from the first surface toward the second surface. As a result, the array circuit layer fabricated on the second surface of the flexible substrate will not be damaged and broken resulted from the protrusion of the flexible substrate.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate the contents and effects to be achieved.

Figure 1:
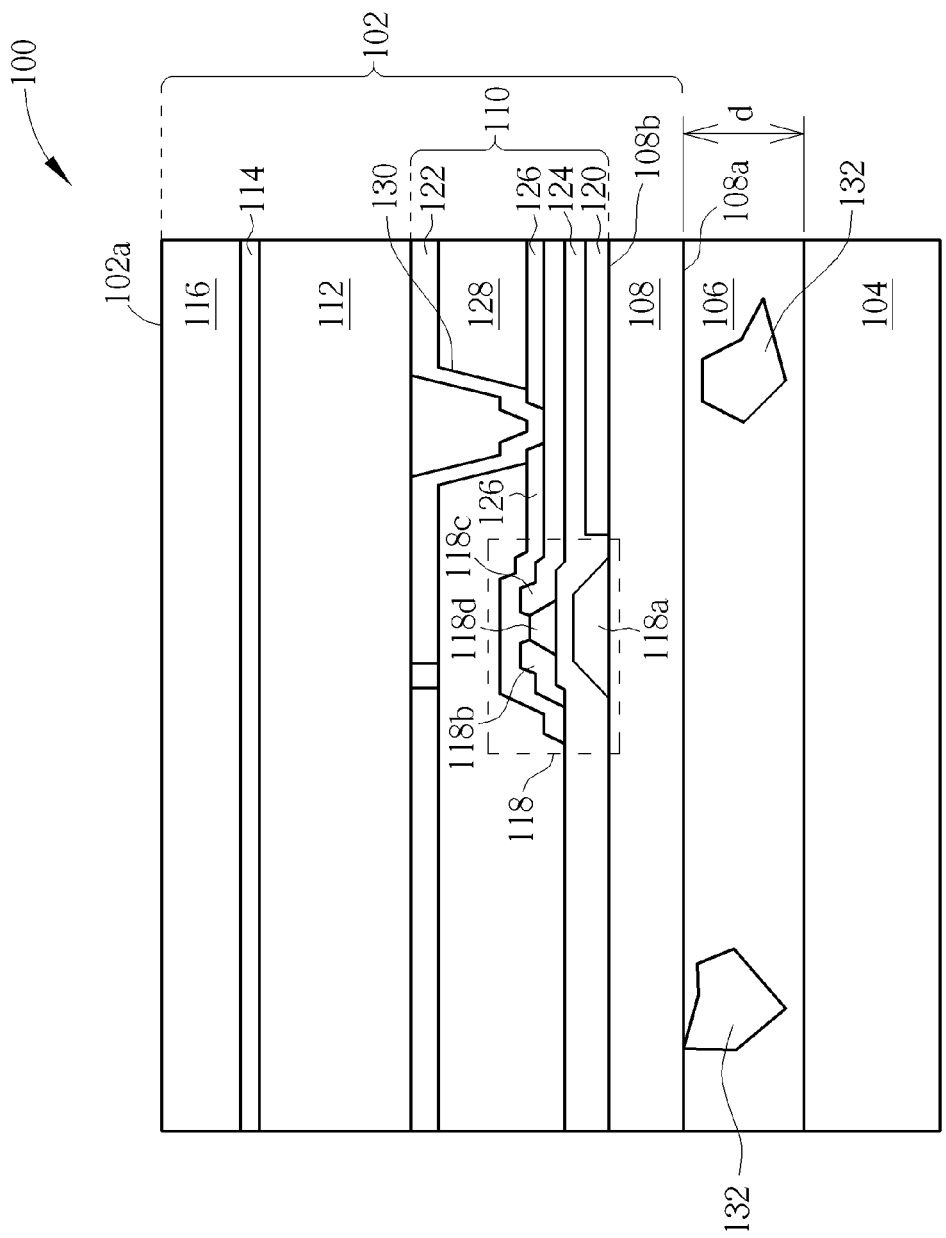
FIG. 1 is a schematic diagram of a sectional view of a flexible display according to a first preferred embodiment of the present invention.

With reference to FIG. 1, FIG. 1 is a schematic sectional diagram of a flexible display according to a first preferred embodiment of the present invention. As shown in FIG. 1, a flexible display 100 includes a flexible opto-electronic display panel 102, a first protection film 104 and a first adhesive layer 106. The flexible opto-electronic display panel 102 includes a flexible substrate 108, an array circuit layer 110, a display media layer 112, a common electrode layer 114 and a second protection film 116. The flexible substrate 108 is composed of flexible material, such as plastic material, and has flexibility, thus the flexible opto-electronic display panel 100 is flexible. Further, the flexible substrate 108 has a first surface 108a and a second surface 108b disposed opposite to each other. The array circuit layer 110 is disposed on the second surface 108b of the flexible substrate 108 for driving the display media layer 112. In this embodiment, the array circuit layer 110 may include the TFT element 118, the common line 120, the data line (not shown), the scan line (not shown), the pixel electrode 122, the first insulating layer 124, the second insulating layer 126 and the planarization layer

128. The first insulating layer 124 covers the gate 118a, the scan line and the common line 120 of the TFT element 118, and the source 118b, the drain 118c and the channel layer 118d of the TFT element 118 and the data line are disposed on the first insulating layer 124. The second insulating layer 126 covers the source 118b, the drain 118c and the channel layer 118d of the TFT element 118 and the data line, and the planarization layer 128 covers the second insulating layer 126 and the first insulating layer 124. The pixel electrode 122 is electrically connected to the drain 118d of the TFT element 118 through the through hole 130 of the planarization layer 128 and the second insulating layer 126. The display media layer 112 is disposed on the pixel electrode 122 of the array circuit layer 110. The common electrode layer 114 is disposed on the display media layer 112 and electrically connected to the common line 120 of the array circuit layer 110. Therefore, the array circuit layer 110 may provide a voltage difference between the pixel electrode 122 and the common electrode layer 114, for driving the display media layer 112 between the pixel electrode 122 and the common electrode layer 114 to display images toward the display surface 102a of the flexible opto-electronic display panel 102. Further, the second protection film 116 covers the common electrode layer 114 for protecting the display media layer 112 and the array circuit layer 110. The display media layer 112 of this embodiment is an electrophoretic display film, thus the flexible opto-electronic display panel 102 is an electrophoretic display panel, but not limited thereto. In other embodiments, the flexible opto-electronic display panel 102 of the present invention may be various, and may be an organic light-emitting diode display panel, a cholesteric liquid crystal display (CLCD) panel, an electro-chromic display panel, etc. In addition, the array circuit layer 110 of the present invention is not limited to the above-mentioned structure and may have other structure or arrangement.

In this embodiment, the first protection film 104 is disposed on the first surface 108a of the flexible substrate 108 for serving as a buffer layer and protecting the flexible substrate 108, and the first adhesive layer 106 is disposed between the first protection film 104 and the flexible substrate 108 and directly contacts the flexible substrate 108 and the first protection film 104, for attaching the first protection film 104 to the flexible substrate 108. In addition, according to this embodiment, the areas of the first protection film 104, the first adhesive layer 106 and the second protection film 116 are substantially the same as the area of the flexible substrate 108, more specifically, the areas of the first protection film 104 and the first adhesive layer 106 are substantially the same as the area of the flexible opto-electronic display panel 102, such that the sidewalls of the first protection film 104 and the first adhesive layer 106 substantially align with the sidewall of the flexible opto-electronic display panel 102, but not limited thereto. It is to be understood that in the descriptions of the specification, the term "aligned with" means that the corresponding sidewalls (or side surface) of two film layers are at the same vertical level or align with each other in a vertical direction, and a certain margin of inaccuracy or error is tolerated. For instance, an error within several millimeters may be tolerable. In addition, the first protection film 104 of the present invention includes a plastic material or metal thin film, and the plastic material may include polyethylene terephthalate (PET), polycarbonate (PC), polyethylene naphthalate (PEN), polymethylmethacrylate (PMMA) or polyimide (PI), but not limited thereto. In another embodiment of the present invention, in order to protect the flexible opto-electronic display panel 102 even from invasion of moisture at the same time, the first protection film 104 and the second protection film 116 may individually further include a water-resistance material so as to provide preferable protection effect and water isolation effect. However, the present invention is not limited by the aforementioned description.

In addition, the first adhesive layer 106 has a thickness d, which is substantially greater than or equal to 30 μm. It is noteworthy that in the fabrication environment, such as a clean room or a fabrication machine, of performing the process of attaching the first protection film 104 to the flexible substrate 108 by using the first adhesive layer 106, only the foreign matters with particle diameters greater than 30 μm can be controlled to keep them away from adhering to the first surface 108a of the flexible substrate 108, while it is possible that the foreign matters 132 with particle diameters less than or equal to 30 μm still can adhere to the first surface 108a of the flexible substrate 108. Since the first adhesive layer 106 of this embodiment is colloidal, it will not press the foreign matters 132 toward the flexible substrate 108. Furthermore, because the first adhesive layer 106 of this embodiment has a thickness d greater than or equal to 30 μm, it can parcel or cover the foreign matters 132 with particle diameters less than or equal to 30 μm therein, such that the foreign matters 132 will not press the flexible substrate 108 during the attaching process of the first protection film 106 and the flexible substrate 108, so as to avoid the protrusion of the flexible substrate 108 toward the second surface 108b. As a result, the array circuit layer 110 fabricated on the second surface 108b of the flexible substrate 108 will not be damaged or broken resulted from the protrusion of the flexible substrate 108.

In the following, the effect of the first adhesive layer with a thickness d greater than or equal to 30 μm of the flexible display according to this embodiment will be further described detailedly. Please refer to Table 1. Table 1 illustrates the electric performance of the array circuit layer under the array circuit layer with different line widths and line spacings and under the conditions that the first adhesive layer has a thickness of 25 μm and 50 μm respectively, wherein the term "line width" means the width of the scan lines/data lines of the array circuit layer, and the term "line spacing" means the distance between any two adjacent scan lines/data lines of the array circuit layer. As shown in Table 1, when the thickness of the first adhesive layer is only about 25 μm, after the first protection film is attached to the flexible substrate through the first adhesive layer, the electric performance of the scan lines/data lines of the array circuit layer on the flexible substrate becomes broken from a non-broken state before attaching the first protect film. However, when the thickness of the first adhesive layer is raised to 50 μm, after attaching the first adhesive layer to the flexible substrate by the first protection film, the scan lines/data lines of the array circuit layer on the flexible substrate are still at the state of non-broken. As a result, if the thickness of the first adhesive layer is greater, the effect of preventing foreign matters (with particle diameters equal to or less than 30 μm) from pressing the flexible substrate will be better, so as to avoid the scan lines/data lines of the array circuit layer being broken caused by foreign matters. Accordingly, to adopt the first adhesive layer with the thickness d greater than or equal to 30 μm in the flexible display of this embodiment effectively prevents the array circuit layer on the flexible substrate from being damaged or broken.

TABLE 1

The electric performance of the array circuit layer under the
array circuit layer with different line width and line spacing

| Line width/<br>Line spacing (μm) | First adhesive layer<br>with thickness of 25 μm | | First adhesive layer<br>with thickness of 50 μm | |
|---|---|---|---|---|
| | Before<br>attachment | After<br>attachment | Before<br>attachment | After<br>attachment |
| 4.5/4.5 | Non-broken | Broken | Non-broken | Non-broken |
| 5/15 | Non-broken | Broken | Non-broken | Non-broken |
| 6/8 | Non-broken | Broken | Non-broken | Non-broken |
| 15/5 | Non-broken | Broken | Non-broken | Non-broken |
| 15/15 | Non-broken | Broken | Non-broken | Non-broken |

The flexible display of the present invention is not limited by the aforementioned embodiment and may have other different preferred or variant embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 2:
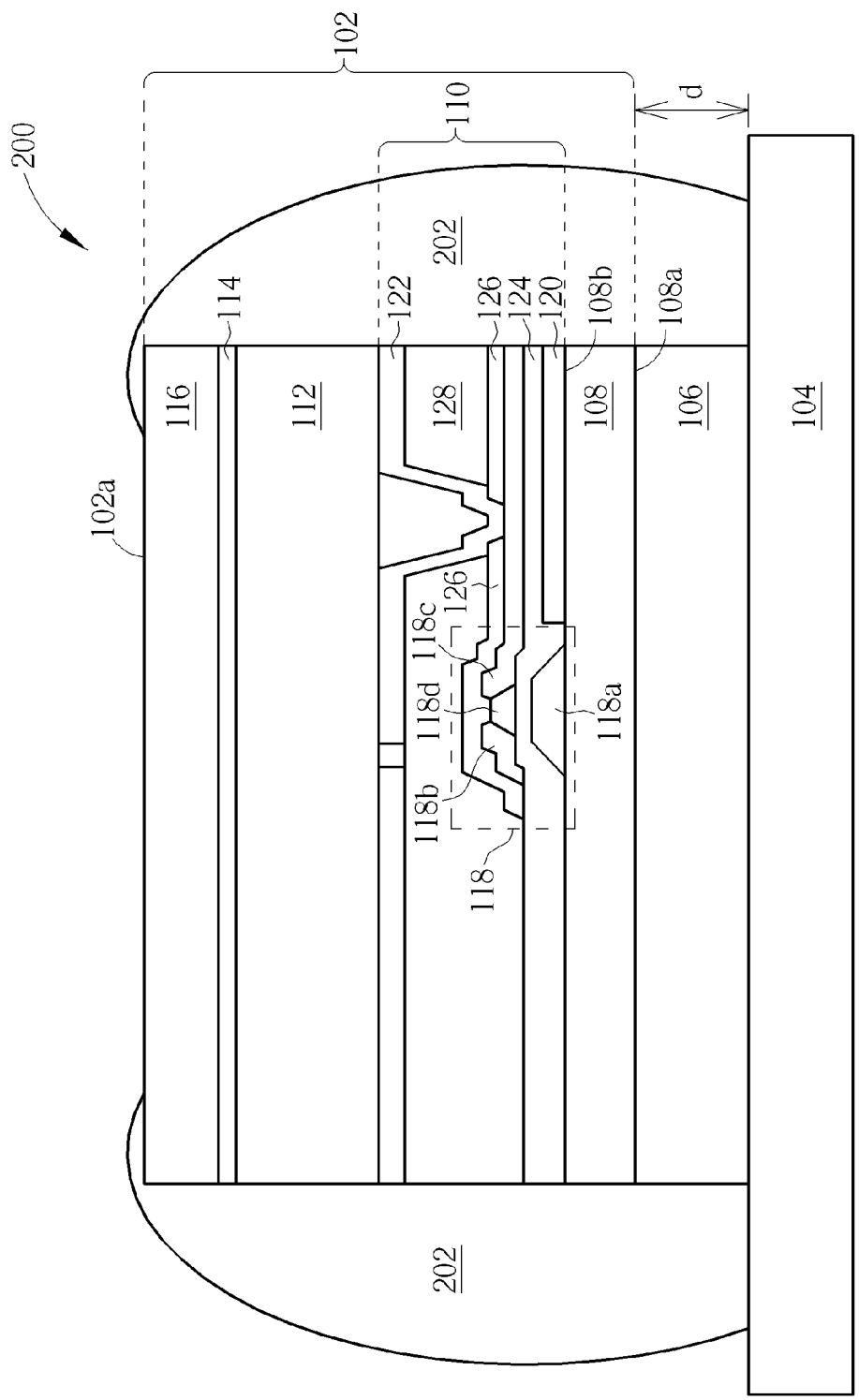
FIG. 2 is a schematic diagram of a sectional view of a flexible display according to a second preferred embodiment of the present invention.

With reference to FIG. 2, FIG. 2 is a schematic diagram of a sectional view of a flexible display according to a second preferred embodiment of the present invention. As shown in FIG. 2, in comparison with the first embodiment, the area of the first protection film 104 of this embodiment is substantially larger than the area of the flexible substrate 108, which means the area of the first protection film 104 is substantially larger than the area of the flexible opto-electronic display panel 102, such that the sidewall of the first protection film 104 is protrudent from the sidewall of the flexible opto-electronic display panel 102. In addition, the flexible display 200 of this embodiment further includes a first water-resisting layer 202 composed of water-resisting material. The first water-resisting layer 202 is disposed on the side of the first protection film 104 having the first adhesive layer 106 arranged thereon, and at the out side of the flexible opto-electronic display panel 102. More specifically, the first water-resisting layer 202 is disposed on the surface of the first protection film 104 that is protrudent from the flexible substrate 108, such that the first water-resisting layer 202 is supported by the first protection film 104 and stands on the first protection layer 104, covering the sidewalls of the first adhesive layer 106, the flexible substrate 108, the array circuit layer 110, the display media layer 112, the common electrode layer 114 and the second protection film 116 and extending to a portion of the top of the second protection film 116. As a result, the first protection layer 104, the first water-resisting layer 202 and the second protection film 116 seal the first adhesive layer 106, the flexible substrate 108, the array circuit layer 110, the display media layer 112 and the common electrode layer 114 and isolate them from moisture. In another embodiment of the present invention, the area of the first adhesive layer 106 may be larger than the area of the flexible substrate 108 and be the same as the area of the first protection film 104, and therefore the first water-resisting layer 202 is disposed on the first adhesive layer 106. Alternatively, the area of the first adhesive layer 106 may also be smaller than the area of the flexible substrate 108, such that the first water-resisting layer 202 can much effectively cover the sidewall of the first adhesive layer 106 to prevent moisture from invading the first adhesive layer 106 through its sidewall.

Figure 3:
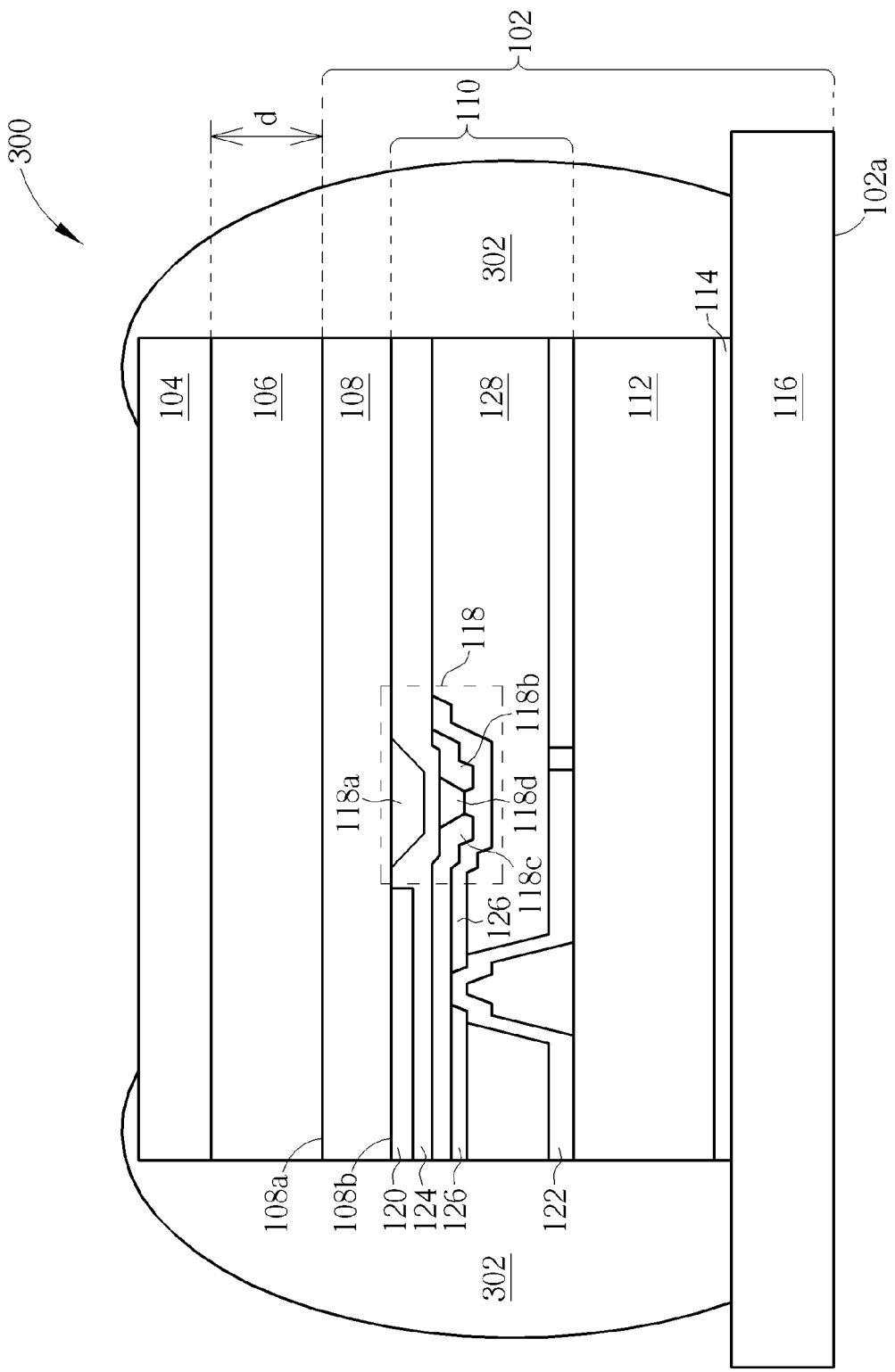
FIG. 3 is a schematic diagram of a sectional view of a flexible display according to a third preferred embodiment of the present invention.

With reference to FIG. 3, FIG. 3 is a schematic diagram of a sectional view of a flexible display according to a third preferred embodiment of the present invention. As shown in FIG. 3, in comparison with the first embodiment, the area of the second protection film 116 of this embodiment is substantially larger than the area of the flexible substrate 108, which means the area of the second protection film 116 is substantially larger than the areas of the common electrode layer 114, the display media layer 112, the array circuit layer 110, the flexible substrate 108, the first adhesive layer 106 and the first protection film 104, such that the sidewall of the second protection film 116 is protrudent from the sidewalls of the common electrode layer 114, the display media layer 112, the array circuit layer 110, the flexible substrate 108, the first adhesive layer 106 and the first protection film 104. Further, the flexible display 300 of this embodiment further includes a first water-resisting layer 302, which is composed of water-resisting material. The first water-resisting layer 302 is disposed on the side of the second protection film 116 facing the display media layer 112, and at the out side of the flexible opto-electronic display panel 102. More specifically, the first water-resisting layer 302 is disposed on the surface of the portion of the second protection film 116 that protrudes from the display media layer 112, such that the first water-resisting layer 302 is supported by the second protection film 116 and stands on the second protection film 116, covering the sidewalls of the common electrode layer 114, the display media layer 112, the array circuit layer 110, the flexible substrate 108, the first adhesive layer 106 and the first protection film 104, extending to a portion of the top of the first protection film 104. Therefore, the first protection film 104, the first water-resisting layer 302 and the second protection film 116 seal the first adhesive layer 106, the flexible substrate 108, the array circuit layer 110, the display media layer 112 and the common electrode layer 114 so as to isolate these layers from moisture.

Figure 4:
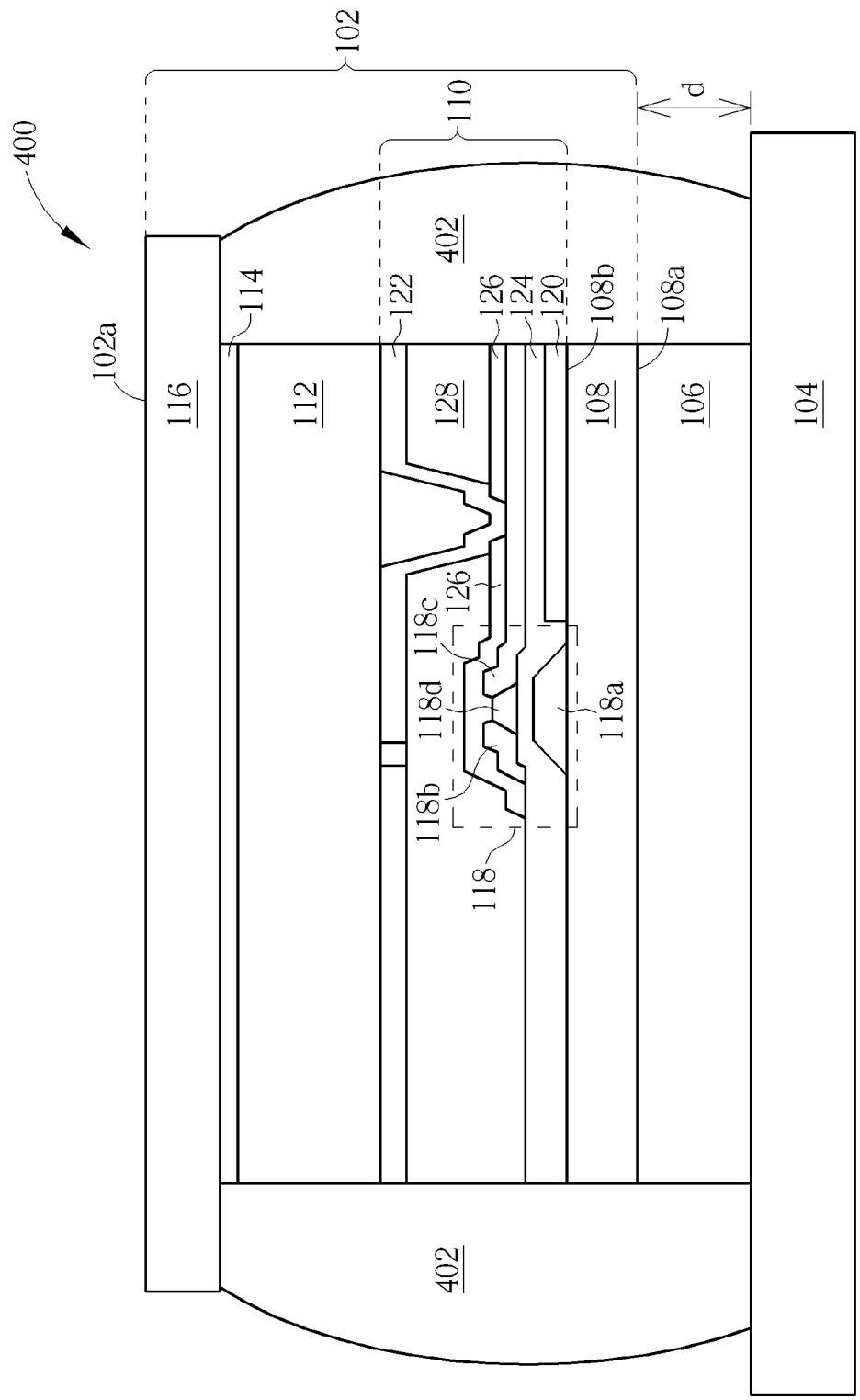
FIG. 4 is a schematic diagram of a sectional view of a flexible display according to a fourth preferred embodiment of the present invention.

With reference to FIG. 4, FIG. 4 is a schematic diagram of a sectional view of a flexible display according to a fourth preferred embodiment of the present invention. As shown in FIG. 4, in comparison with the first embodiment, the areas of the first protection film 104 and the second protection film 116 of this embodiment are substantially larger than the area of the flexible substrate 108, which means that the sidewalls of the first protection film 104 and the second protection film 116 both protrudes from the sidewalls of the common electrode layer 114, the display media layer 112, the array circuit layer 110, the flexible substrate 108, the first adhesive layer 106 and the first protection layer 104. In addition, the flexible display 400 of this embodiment further includes a first water-resisting layer 402, which is composed of water-resisting material. The first water-resisting layer 402 is disposed between the first protection film 104 and the second protection film 116, at the out side of the flexible opto-electronic display panel 102. More specifically, the first water-resisting layer 402 is disposed between the surface of the portion of the first protection film 104 protrudent from the flexible substrate 108 and the surface of the portion of the second protection film 116 protrudent from the display media layer 112, such that the first water-resisting layer 402 is supported by the first protection film 104 and the second protection film 116 and covers the space between the first protection film 104 and the second protection film 116, which means the first water-resisting layer 402 covers the sidewalls of the common electrode layer 114, the display media layer 112, the array circuit layer 110, the flexible substrate 108 and the first adhesive layer 106. Therefore, the first protection film 104, the first water-resisting layer 402 and the second protection film 116 seal the first adhesive layer 106, the flexible substrate 108, the array circuit layer 110, the display media layer 112 and the common electrode layer 114 to isolate these layers from moisture.

Figure 5:
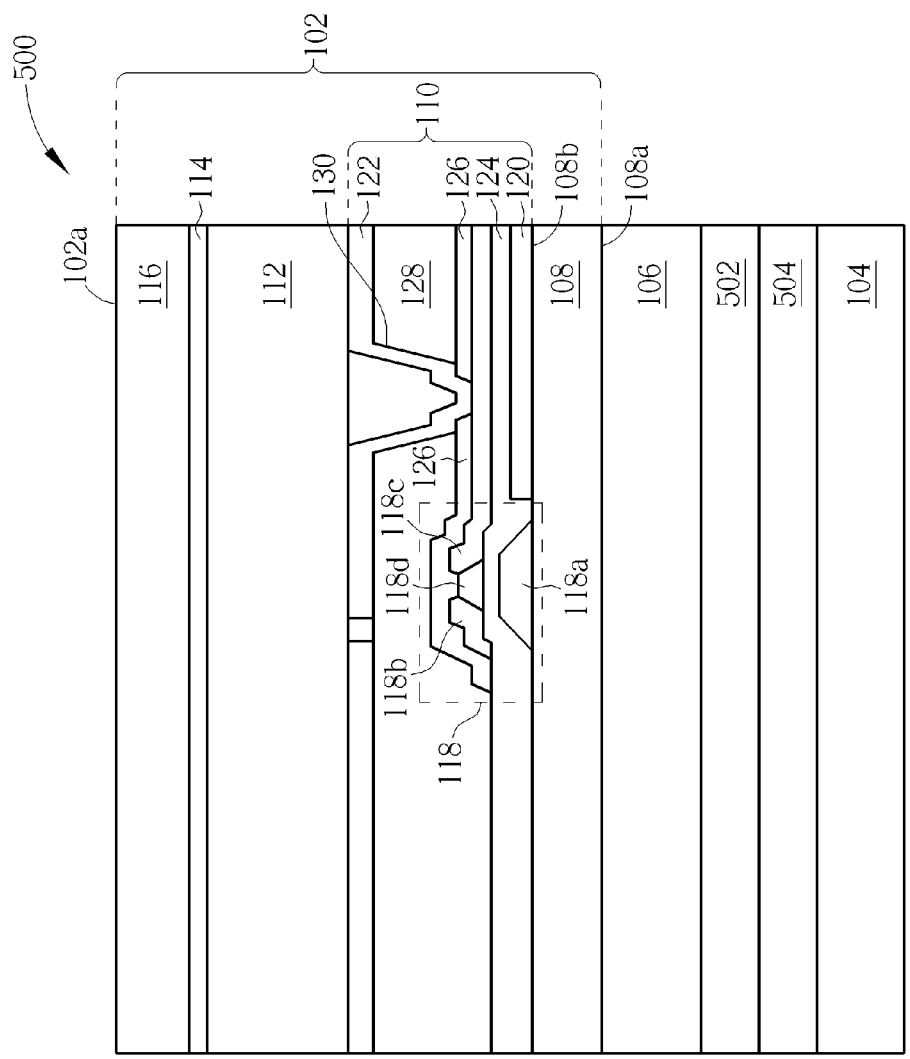
FIG. 5 is a schematic diagram of a sectional view of a flexible display according to a fifth preferred embodiment of the present invention.

With reference to FIG. 5, FIG. 5 is a schematic diagram of a sectional view of a flexible display according to a fifth preferred embodiment of the present invention. As shown in FIG. 5, in comparison with the first embodiment, the flexible display 500 of this embodiment further includes a second water-resisting layer 502 and a second adhesive layer 504. The second water-resisting layer 502 is composed of water-resisting material and is disposed between the first adhesive layer 106 and the first protection film 104, for blocking moisture from entering through the first surface 108a of the flexible substrate 108. The second water-resisting layer 502 may be attached to the first surface 108a of the flexible substrate 108 through the first adhesive layer 106. Further, the second adhesive layer 504 is disposed between the second water-resisting layer 502 and the first protection film 104, for attaching the first protection film 104 to the second water-resisting layer 502.

Figure 6:
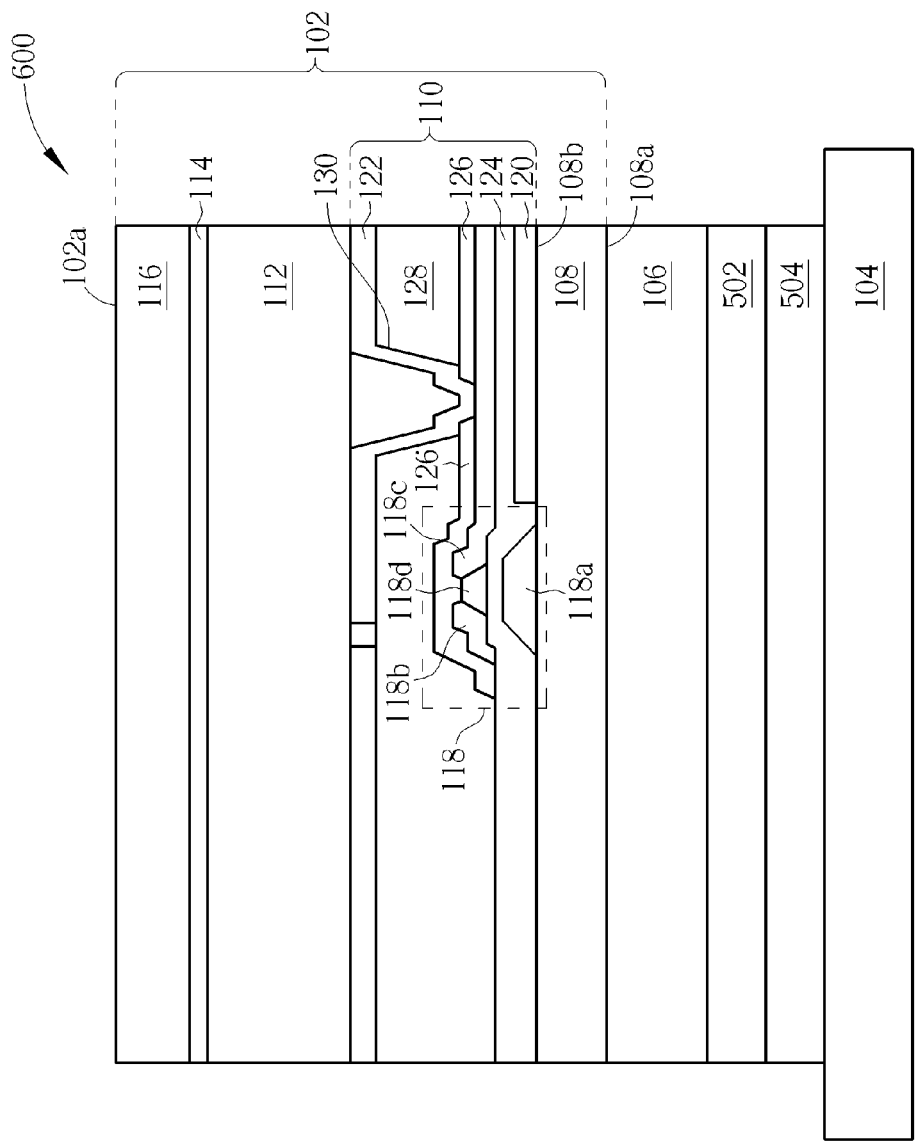
FIG. 6 is a schematic diagram of a sectional view of a flexible display according to a sixth preferred embodiment of the present invention.

With reference to FIG. 6, FIG. 6 is a schematic diagram of a sectional view of a flexible display according to a sixth preferred embodiment of the present invention. As shown in FIG. 6, in comparison with the fifth embodiment, the area of the first protection film 104 of the flexible display 600 of this embodiment is substantially larger than the area of the flexible substrate 108, which means that the area of the first protection film 104 is substantially larger than the area of the flexible opto-electronic display panel 102, such that the sidewall of the first protection film 104 protrudes from the sidewall of the flexible opto-electronic display panel 102.

Figure 7:
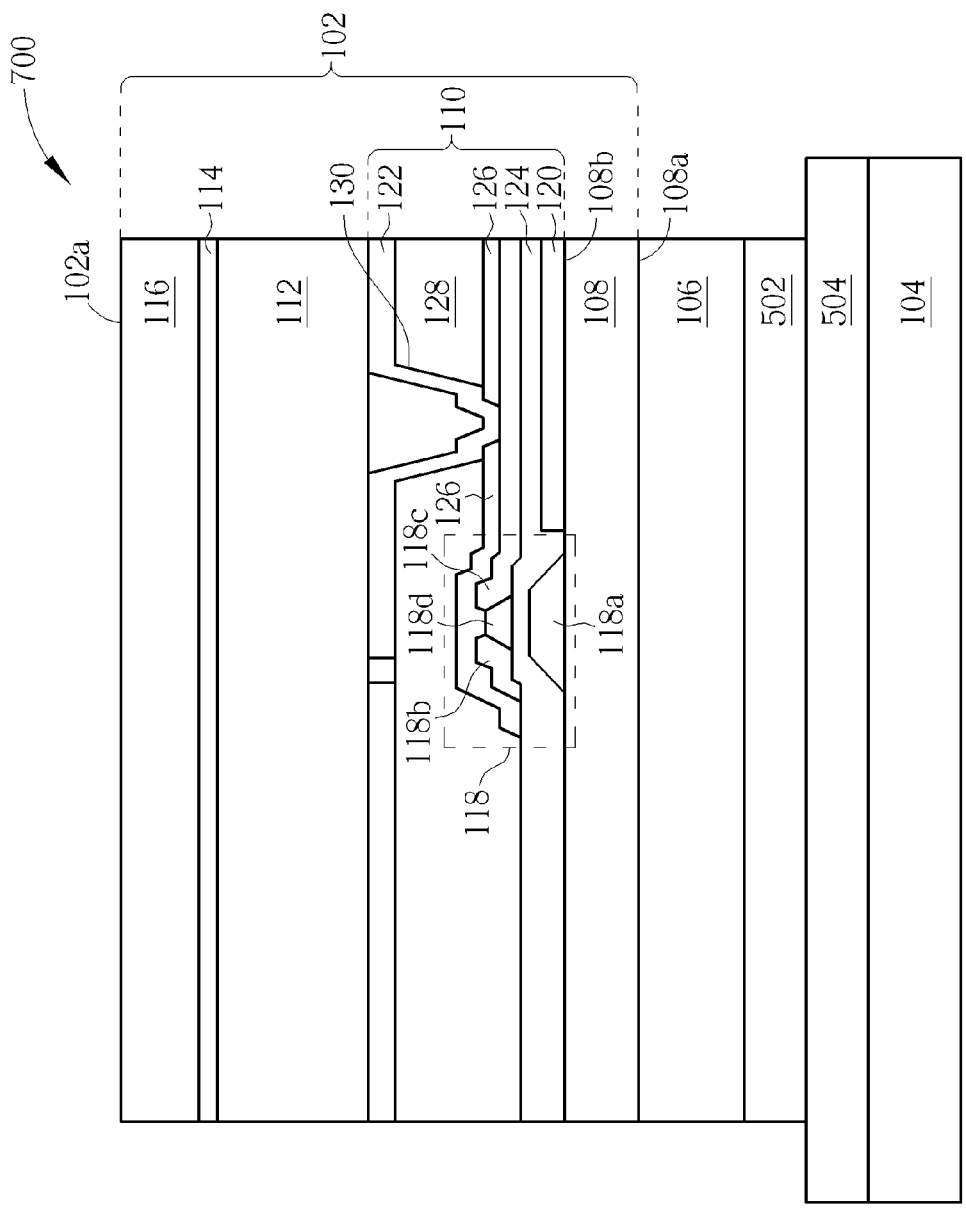
FIG. 7 is a schematic diagram of a sectional view of a flexible display according to a seventh preferred embodiment of the present invention.

With reference to FIG. 7, FIG. 7 is a schematic diagram of a sectional view of a flexible display according to a seventh preferred embodiment of the present invention. As shown in FIG. 7, in comparison with the sixth embodiment, the area of the second adhesive layer 504 of the flexible display 700 of this embodiment is substantially larger than the area of the flexible substrate 108, which means that the area of the second adhesive layer 504 is substantially larger than the area of the flexible opto-electronic display panel 102, such that the sidewalls of the first protection film 104 and the second adhesive layer 504 protrude from the sidewall of the flexible opto-electronic display panel 102.

Figure 8:
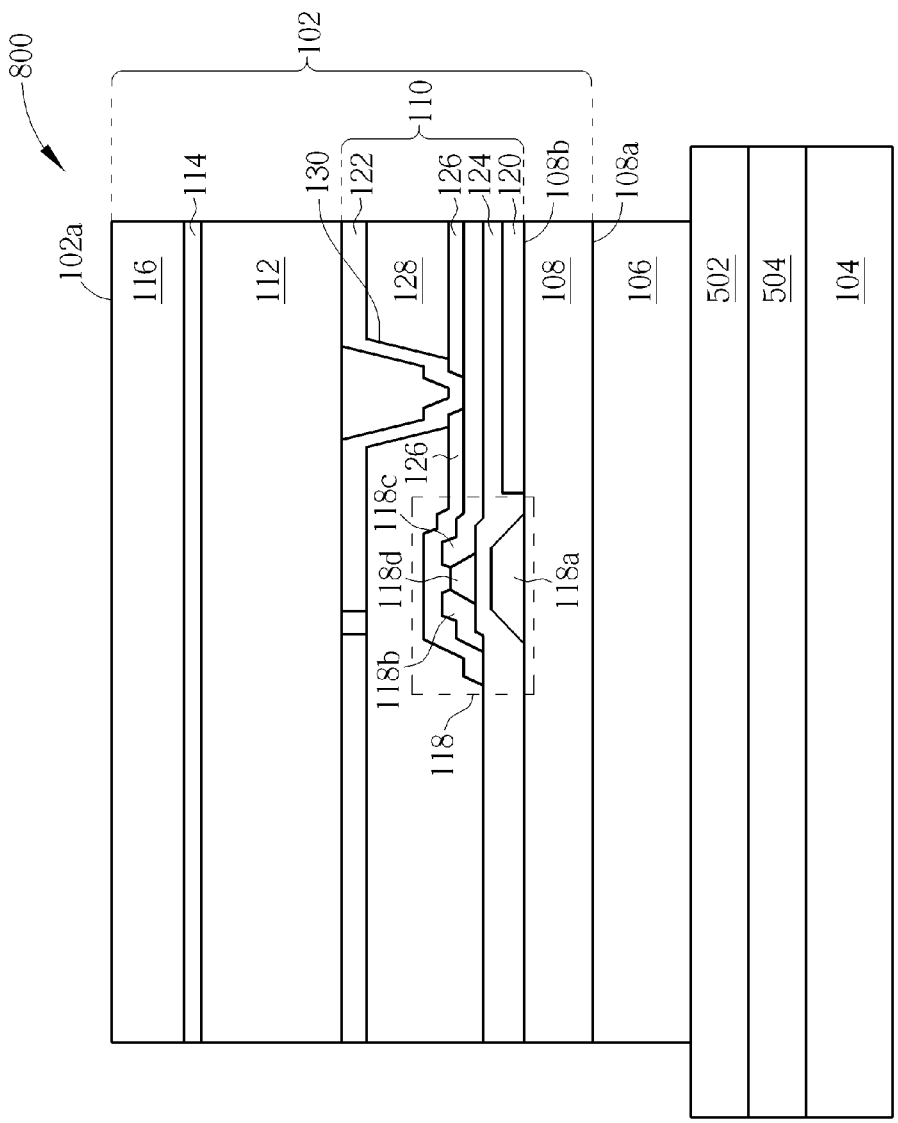
FIG. 8 is a schematic diagram of a sectional view of a flexible display according to an eighth preferred embodiment of the present invention.

With reference to FIG. 8, FIG. 8 is a schematic diagram of a sectional view of a flexible display according to an eighth preferred embodiment of the present invention. As shown in FIG. 8, in comparison with the seventh embodiment, the area of the second water-resisting layer 502 of the flexible display 800 of this embodiment is substantially larger than the area of the flexible substrate 108, which means the area of the second water-resisting layer 502 is substantially larger than the area of the flexible opto-electronic display panel 102, such that the sidewalls of the first protection film 104, the second adhesive layer 504 and the second water-resisting layer 502 protrude from the sidewall of the flexible opto-electronic display panel 102.

Figure 9:
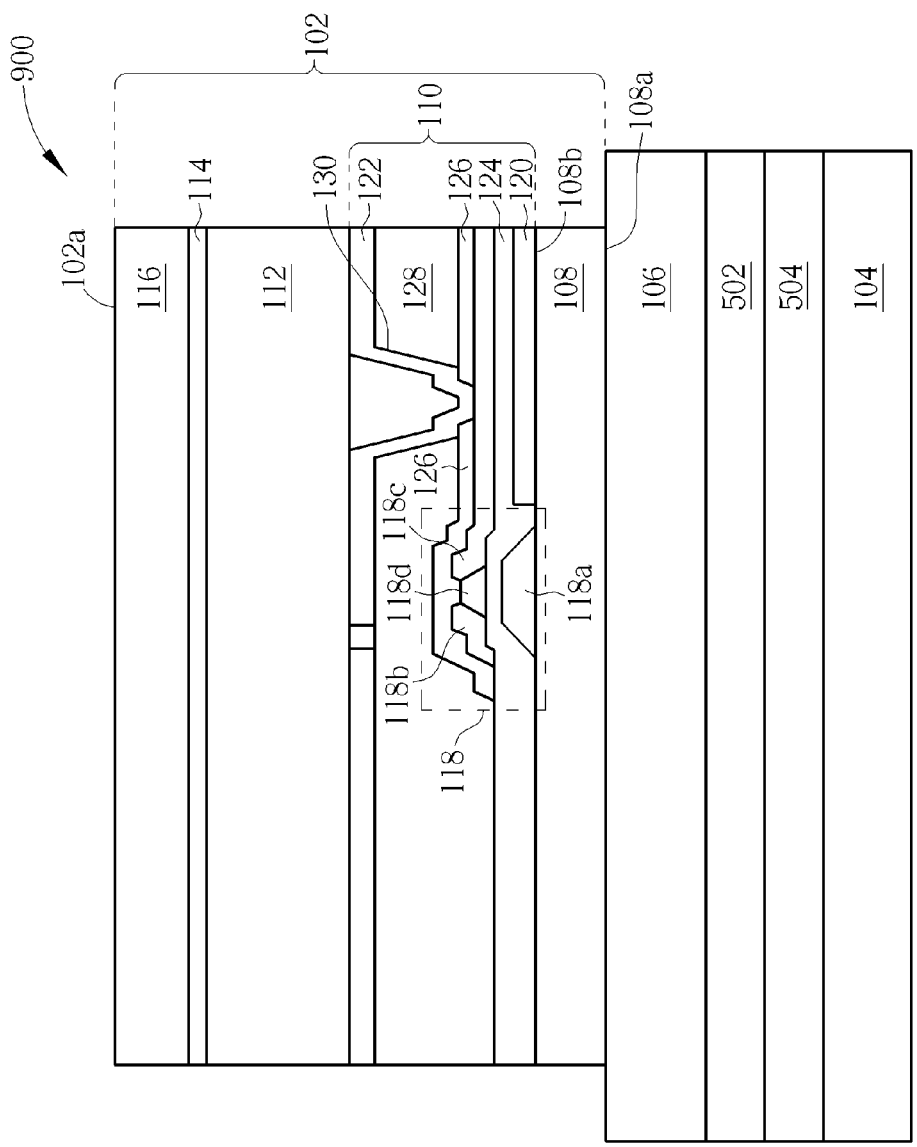
FIG. 9 is a schematic diagram of a sectional view of a flexible display according to a ninth preferred embodiment of the present invention.

With reference to FIG. 9, FIG. 9 is a schematic diagram of a sectional view of a flexible display according to a ninth preferred embodiment of the present invention. As shown in FIG. 9, in comparison with the eighth embodiment, the area of the first adhesive layer 106 of the flexible display 900 of this embodiment is substantially larger than the area of the flexible substrate 108, which means that the area of the first adhesive layer 106 is substantially larger than the area of the flexible opto-electronic display panel 102, such that the sidewalls of the first protection film 104, the second adhesive layer 504, the second water-resisting layer 502 and the first adhesive layer 106 protrude from the sidewall of the flexible opto-electronic display panel 102.

In other embodiments of the present invention, the flexible display may include a first water-resisting layer disposed between the first protection layer and the flexible substrate and a second water-resisting layer covering the sidewalls of the first adhesive layer, the flexible substrate, the array circuit layer, the display media layer and the common electrode layer, so as to effectively seal the first adhesive layer, the flexible substrate, the array circuit layer, the display media layer and the common electrode layer and block moisture from entering the flexible display.

In conclusion, the thickness of the first adhesive layer for attaching the first protection film to the first surface of the flexible substrate of the present invention is raised to greater than or equal to 30 μm, so as to effectively cover and parcel the foreign matters with particle diameters less than or equal to 30 μm in the first adhesive layer. Therefore, the foreign matters will not press the flexible substrate during the process of attaching the first protection film to the flexible substrate, which avoid the protrusion of the flexible substrate toward the second surface. As a result, the array circuit layer fabricated on the second surface of the flexible substrate is free from damage and being broken caused by the protrusion of the flexible substrate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flexible display, comprising:
   a flexible substrate, having a first surface and a second surface opposite to each other;
   an array circuit layer, disposed on the second surface of the flexible substrate;
   a first protection film, disposed on the first surface of the flexible substrate; and
   a first adhesive layer, disposed between the first protection film and the flexible substrate, and the first adhesive layer having a thickness substantially greater than or equal to 30 micrometers (μm).

2. The flexible display of claim 1, wherein the first adhesive layer directly contact the flexible substrate.

3. The flexible display of claim 1, further comprising:
   a display media layer, disposed on the array circuit layer; and
   a second protection film, disposed on the display media layer.

4. The flexible display of claim 3, wherein an area of the first protection film is substantially larger than an area of the flexible substrate, and the flexible display further comprises a first water-resisting layer disposed on a side of the first protection film facing the first adhesive layer, the first water-resisting layer covering a sidewall of the first adhesive layer, a sidewall of the flexible substrate, a sidewall of the array circuit layer, a sidewall of the display media layer and a sidewall of the second protection film.

5. The flexible display of claim 3, wherein an area of the second protection film is substantially larger than an area of the flexible substrate, and the flexible display further comprises a first water-resisting layer disposed at a side of the second protection film facing the display media layer, the first water-resisting layer covering a sidewall of the first protection film, a sidewall of the first adhesive layer, a sidewall of the flexible substrate, a sidewall of the array circuit layer and a sidewall of the display media layer.

6. The flexible display of claim 3, wherein an area of the first protection film and an area of the second protection film are substantially larger than an area of the flexible substrate, and the flexible display further comprises a first water-resisting layer disposed between the first protection film and the second protection film, the first water-resisting covering a sidewall of the first adhesive layer, a sidewall of the flexible substrate, a sidewall of the array circuit layer and a sidewall of the display media layer.

7. The flexible display of claim 1, wherein the first protection film comprises a plastic material, a metal thin film or a water-resisting material.

8. The flexible display of claim 7, wherein the plastic material comprises polyethylene terephthalate (PET), polycarbonate (PC), polyethylene naphthalate (PEN), polymethylmethacrylate (PMMA) or polyimide (PI).

9. The flexible display of claim 1, further comprising a second water-resisting layer disposed between the first adhesive layer and the first protection film.

10. The flexible display of claim 9, further comprising a second adhesive layer disposed between the second water-resisting layer and the first protection film.

11. The flexible display of claim 10, wherein an area of the first protection film is substantially larger than an area of the flexible substrate.

12. The flexible display of claim 11, wherein an area of the second adhesive layer is substantially larger the area of the flexible substrate.

13. The flexible display of claim 12, wherein an area of the second water-resisting layer is substantially larger than the area of the flexible substrate.

14. The flexible display of claim 13, wherein an area of the first adhesive layer is substantially larger than the area of the flexible substrate.

* * * * *